US010173161B2

(12) United States Patent
Pfannenberg

(10) Patent No.: US 10,173,161 B2
(45) Date of Patent: Jan. 8, 2019

(54) FILTER FAN FOR INSERTION IN AN OPENING IN A WALL OF A CASING OF WASTE HEAT PRODUCING COMPONENTS

(75) Inventor: Andreas Pfannenberg, Hamburg (DE)

(73) Assignee: PFANNENBERG GMBH, Hamburg (DE)

( * ) Notice: Subject to any disclaimer, the term of this patent is extended or adjusted under 35 U.S.C. 154(b) by 502 days.

(21) Appl. No.: 11/731,808

(22) Filed: Mar. 30, 2007

(65) Prior Publication Data

US 2008/0014858 A1 Jan. 17, 2008

(30) Foreign Application Priority Data

Apr. 5, 2006 (DE) .................... 20 2006 005 673 U

(51) Int. Cl.
  H05K 7/20 (2006.01)
  B01D 46/00 (2006.01)
  B01D 46/42 (2006.01)
  F04D 29/70 (2006.01)
(52) U.S. Cl.
  CPC ..... B01D 46/0004 (2013.01); B01D 46/0027 (2013.01); B01D 46/42 (2013.01); F04D 29/703 (2013.01); H05K 7/20181 (2013.01)
(58) Field of Classification Search
  CPC .................................. B01D 64/0004
  USPC ....... 454/276, 277, 279, 280, 278, 281, 282, 454/283, 350, 221, 224, 268
  See application file for complete search history.

(56) References Cited

U.S. PATENT DOCUMENTS

| | | | | | |
|---|---|---|---|---|---|
| 903,340 | A | * | 11/1908 | Townsend | ............ B61D 19/002 160/114 |
| 2,194,388 | A | * | 3/1940 | Haugh | .................... E06B 7/082 454/282 |
| 2,575,499 | A | * | 11/1951 | Manow | ......................... 55/422 |
| 2,842,042 | A | * | 7/1958 | Rose | ........................ E06B 7/02 454/277 |
| 2,962,956 | A | * | 12/1960 | Magyar | ................... F24F 13/08 454/281 |
| 3,968,738 | A | * | 7/1976 | Matzke | ................... E06B 7/082 454/309 |

(Continued)

FOREIGN PATENT DOCUMENTS

| | | | |
|---|---|---|---|
| CH | 659879 | A5 * | 2/1987 |
| DE | 200 02 124 | | 5/2000 |

(Continued)

OTHER PUBLICATIONS

Translation of DE10038821.*
Translation of DE2000124.*

Primary Examiner — Gregory Huson
Assistant Examiner — Frances F Hamilton
(74) Attorney, Agent, or Firm — Lucas & Mercanti, LLP; Klaus P. Stoffel

(57) ABSTRACT

A covering device covers a front area of a device for the passage of air. The device for the passage of air fits in an opening in a wall of a casing, in particular a casing of waste heat producing components, of an electronic cupboard, or of a switch cupboard. The covering device also covers a filter mat of the device for the passage of air. The covering device includes a cover covering the filter mat with a number of inclined lamellar elements, each lamellar element has in its upper area a section with a hook-type configuration orientated against the air admission.

6 Claims, 10 Drawing Sheets

(56) References Cited

U.S. PATENT DOCUMENTS

| | | | |
|---|---|---|---|
| 4,330,047 A * | 5/1982 | Ruspa et al. | 181/224 |
| 4,880,192 A * | 11/1989 | Vom Braucke et al. | 248/110 |
| 5,163,871 A * | 11/1992 | Huibregtse | F24F 13/08 |
| | | | 454/289 |
| 5,766,072 A | 6/1998 | Andersson | |
| 5,931,979 A * | 8/1999 | Immel | 55/385.6 |
| 6,226,922 B1 * | 5/2001 | Swapp | 49/92.1 |
| 6,378,262 B1 * | 4/2002 | Mercadante | 52/473 |
| 6,902,597 B2 * | 6/2005 | Wu | B01D 46/26 |
| | | | 55/459.3 |
| D512,503 S * | 12/2005 | Roland | D23/412 |
| 7,322,881 B2 * | 1/2008 | Ishii | B41J 2/1408 |
| | | | 399/92 |
| 2003/0026074 A1 * | 2/2003 | Clements | H05K 7/20181 |
| | | | 361/695 |
| 2004/0077304 A1 * | 4/2004 | Pfannenberg | F24F 13/28 |
| | | | 454/184 |
| 2008/0045135 A1 * | 2/2008 | Pfannenberg | F04D 29/646 |
| | | | 454/184 |
| 2010/0056038 A1 * | 3/2010 | Ramsay | F24F 7/02 |
| | | | 454/364 |

FOREIGN PATENT DOCUMENTS

| | | | |
|---|---|---|---|
| DE | 100 38 821 | | 1/2002 |
| EP | 260973 | A2 * | 3/1988 |
| GB | 1329862 | * | 9/1970 |
| GB | 2211598 | A * | 7/1989 |
| RU | 2122685 | C1 | 11/1998 |
| RU | 27948 | U1 | 2/2003 |
| SU | 821858 | A1 | 4/1981 |
| SU | 994871 | A2 | 2/1983 |
| SU | 1771527 | A3 | 10/1992 |
| WO | 91/14138 | A | 9/1991 |

* cited by examiner

FILTER FAN FOR INSERTION IN AN OPENING IN A WALL OF A CASING OF WASTE HEAT PRODUCING COMPONENTS

FIELD OF APPLICATION

This invention relates to a covering device for the front area of a device for the passage of air according to the preamble of claim 1 as well as a device for the passage of air.

PRIOR ART

Such a covering device which is sometimes also designated as covering casing, as covering plate, as cover plate or even as "design cover", is generally placed before the front area of a filter fan. Since such a filter fan in operation sucks (ambient) air through a filter mat, it cannot be avoided that the covering device also sucks liquid particles or liquids drops—such as rain water drops in case of outer parts of the filter fan—which are in the (ambient) air. Liquid as well as substances with a liquid like consistency necessarily accumulate in the area of the covering device, in particular in the area between the covering device and the filter fan.

Aim, Solution, Advantage

Thus, the aim of this invention is to provide the design cover of a device for the passage of air with lamellar elements which prevent or reduce the penetration of water or dust particles into the filter mat and which guarantee the retaining and outer discharge of water without reducing the air direct flow quantity.

This aim is achieved for a covering device according to the art with the characteristics indicated in claim 1. Accordingly, the invention consists in that each lamellar element has in its upper area a section with a hook-type configuration orientated against the air admission.

The section with the hook-type configuration extends over the length of the lamellar element.

This being, the lamellar elements are placed with respect to each other in such a manner that the lamellar elements overlap sectionwise, whereby the lower area of each lamellar element is situated on a section horizontal plane E below the section with the hook-type configuration or on a horizontal plane E1 situated above the section with the hook-type configuration or in an area between both planes E and E1.

Further advantageous configurations and appropriate improvements of the invention are characterized in the subclaims.

According to a further embodiment, the covering device consists of a frame-type casing for receiving the filter mat and a design cover held fixedly, detachably or swivellably in the casing and covering the filter mat, which comprises at least two lateral retaining elements having preferably the shape of cheeks, extending on the edge in a longitudinal direction, between which several lamellar elements are placed which are placed spaced from each other by simultaneously overlapping each other sectionwise and which are placed obliquely in such a manner that the respectively front and outer situated lamellar edges are placed lower than the rear lamellar edges, whereby the upper rear lamellar edges of the lamellar elements which have preferably an arc-shaped configuration, have a barb-shaped configuration.

The single lamellar elements are placed with respect to each other in such a manner that a high optical overlapping and a visual protection of the filter mat is obtained with an optimal air permeability.

For achieving a noise optimized lamellar shape, each lamellar element has rounded front lamellar edges.

Furthermore, the invention provides that the rear lamellar border edge which has the barber-type configuration of each lamellar element has a cross-section shape which corresponds approximately to the shape of a half circle with a section projecting on the front side.

A further embodiment of the invention consists in that the area of the front lamellar edge of each lamellar element has a material reinforcement so that the lower situated front border edge area of each lamellar element has a bigger thickness compared to the rear and higher situated border edge area.

Due to the configuration according to the invention of the covering device, in particular due to the conformation of the single lamellar elements, it is achieved that dust and water sucked by the fan of the filter fan is at least or partially retained by the lamellar elements. Water meeting onto the covering device mainly runs out outwards so that the filter mat is only slightly or little wetted by the water.

Moreover, the invention according to claim 11 relates to a device for the passage of air, such as a filter fan or outlet filter, for fitting in an opening in a wall of a casing, in particular of a casing of waste heat producing components, of an electronic cupboard, of a switch cupboard, of a casing system or of a computer system, with a covering device, in particular for covering the front area of the device for the passage of air and for the filter mat of the device for the passage of air, whereby the covering device comprises a design cover covering the filter mat with a number of inclined lamellar elements, whereby each lamellar element has in its upper area a section with a hook-type configuration orientated against the air admission.

For this embodiment too, the section with the hook-type configuration extends over the length of the lamellar element.

The lamellar elements are placed with respect to each other in such a manner that the lamellar elements overlap sectionwise, whereby the lower area of each lamellar element is situated on a horizontal plane E below the section with the hook-type configuration or on a horizontal plane E1 above the section with the hook-type configuration or in an area between the two planes E and E1.

Improvements of the device for the passage of air with the covering device are the subject of the claims 12 to 20.

SHORT DESCRIPTION OF THE DRAWINGS

Embodiments of the invention are represented in the drawings.

DETAILED DESCRIPTION OF THE INVENTION AND BEST WAY FOR CARRYING OUT THE INVENTION

Figure 1:
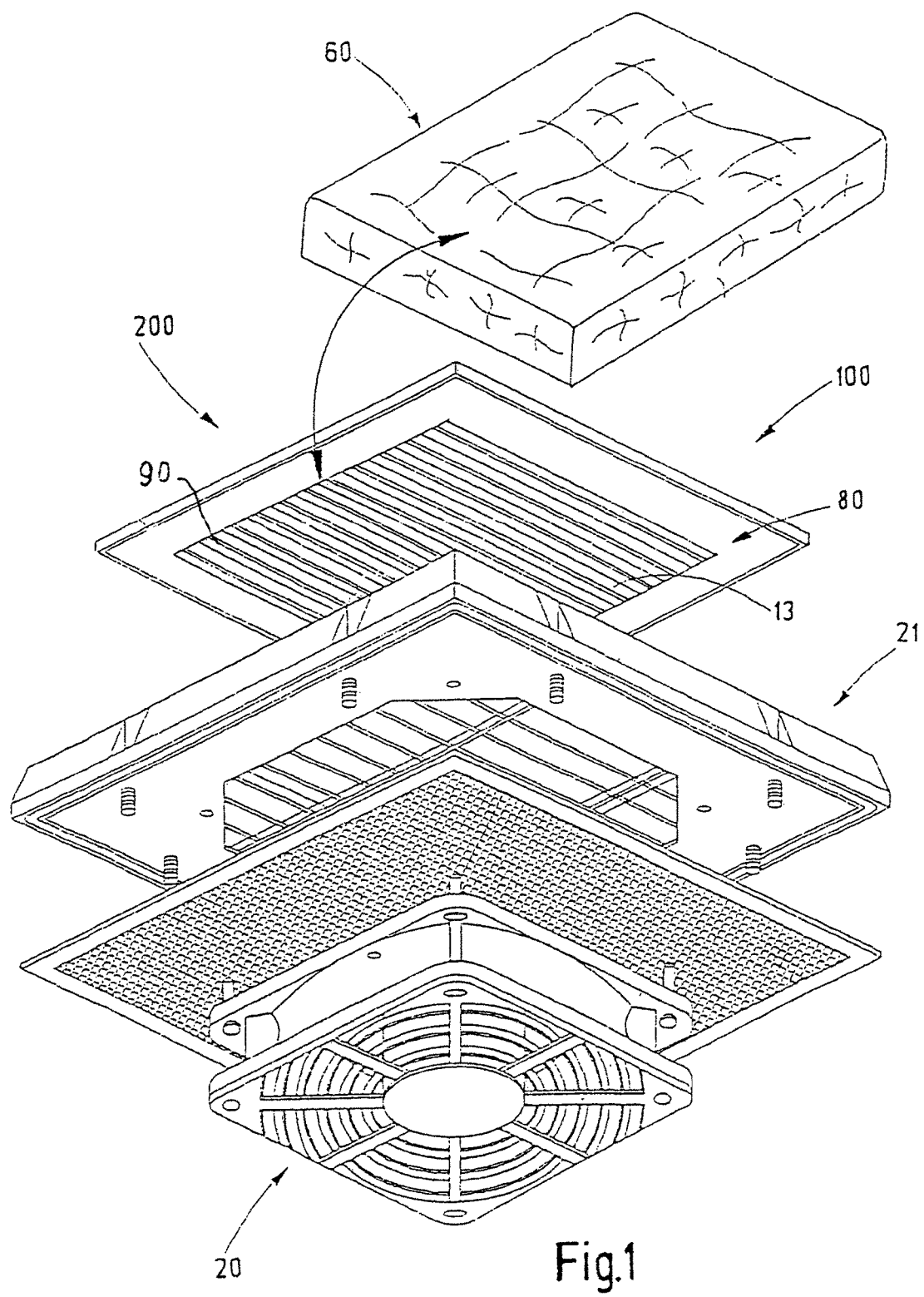
FIG. 1 shows a perspective exploded view of a device for the passage of air as a filter fan with the covering device configured according to the invention as a design cover with lamellar elements configured in the design cover.
Figure 2:
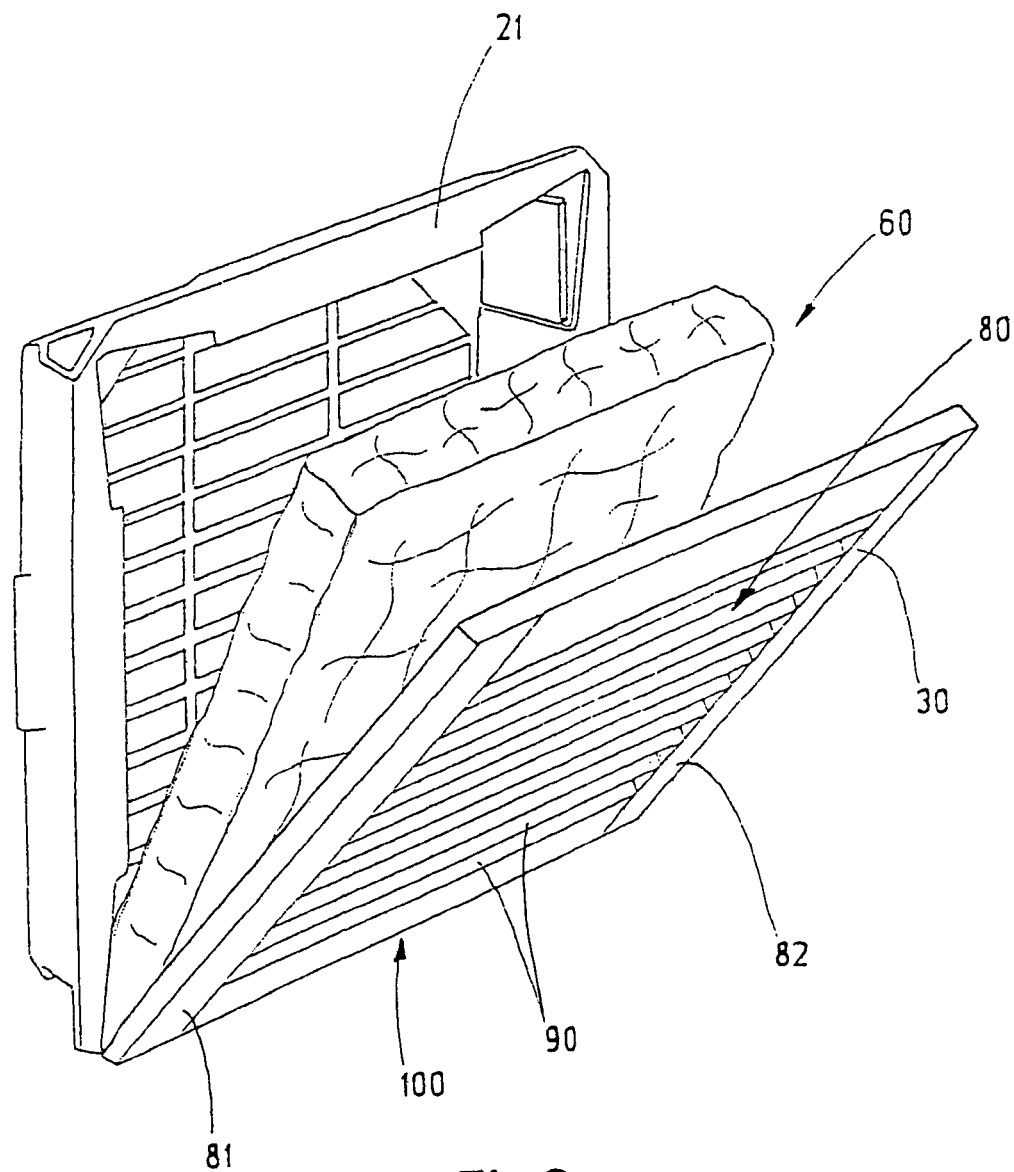
FIG. 2 shows a graphical representation of the basic casing of the device for the passage of air with a design cover swung open and with a filter mat situated between the basic casing and the design cover.
Figure 3:
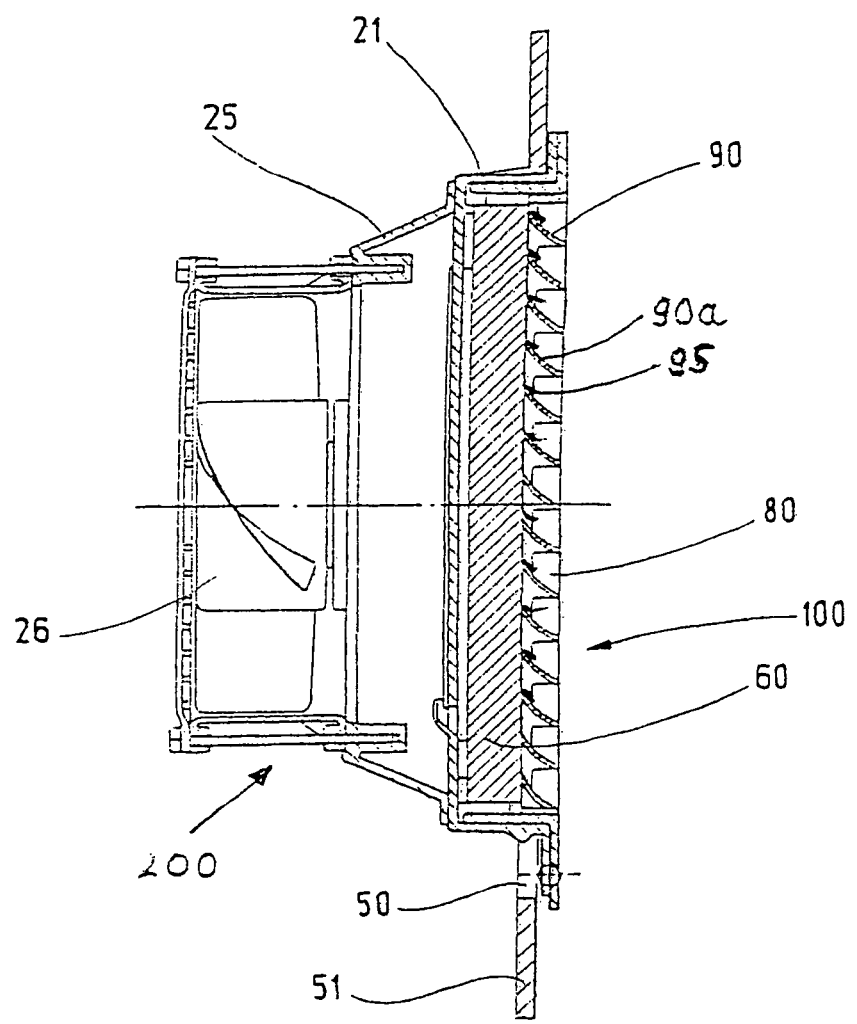
FIG. 3 shows a vertical section through the device for the passage of air.

The device for the passage of air 200 represented in FIG. 1 to 3 can be used as outlet filter in relation with a blast or fan as a filter fan and without fan 20 as an outlet filter. The device for the passage of air 200 is used for casings of waste heat producing components such as switch cupboards, electronic cupboards, computer systems or the like, whereby the device for the passage of air 200 is mounted in mounting openings 50 in a wall 59 of such a casing (FIG. 3).

The essential components of the device for the passage of air 200 are a fan grid which is configured as design cover 80 with aeration slits and the covering device according to the invention 100 forms a basic casing 21, a blast support 25 for the blast 26 and the blast 26 when the device for the passage of air 200 is used as a filter fan (FIG. 1 to 3).

The covering device 100 which constitutes the fan grid, is configured as a design cover 80 and consists of a frame-type casing 30 with lamellar elements 90, whereby aeration slits are configured between the sectionwise overlapping lamellar elements 90. The filter mat 60 can be held on the inner wall surface of the design cover 80 (FIG. 3) or it is inserted in the basic casing. The lamellar elements 90 are held in retaining elements 81, 82 which constitute the frame of the design cover 80.

Figure 4:
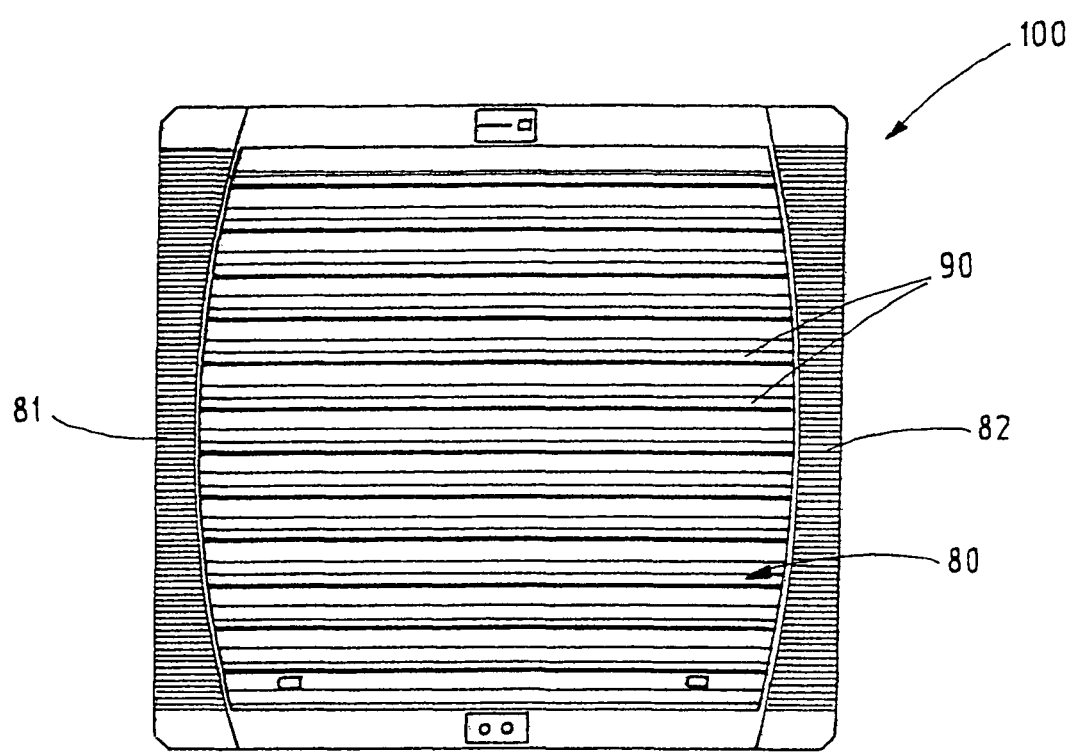
FIG. 4 shows a front view of the design cover with lamellar elements.
Figure 5:
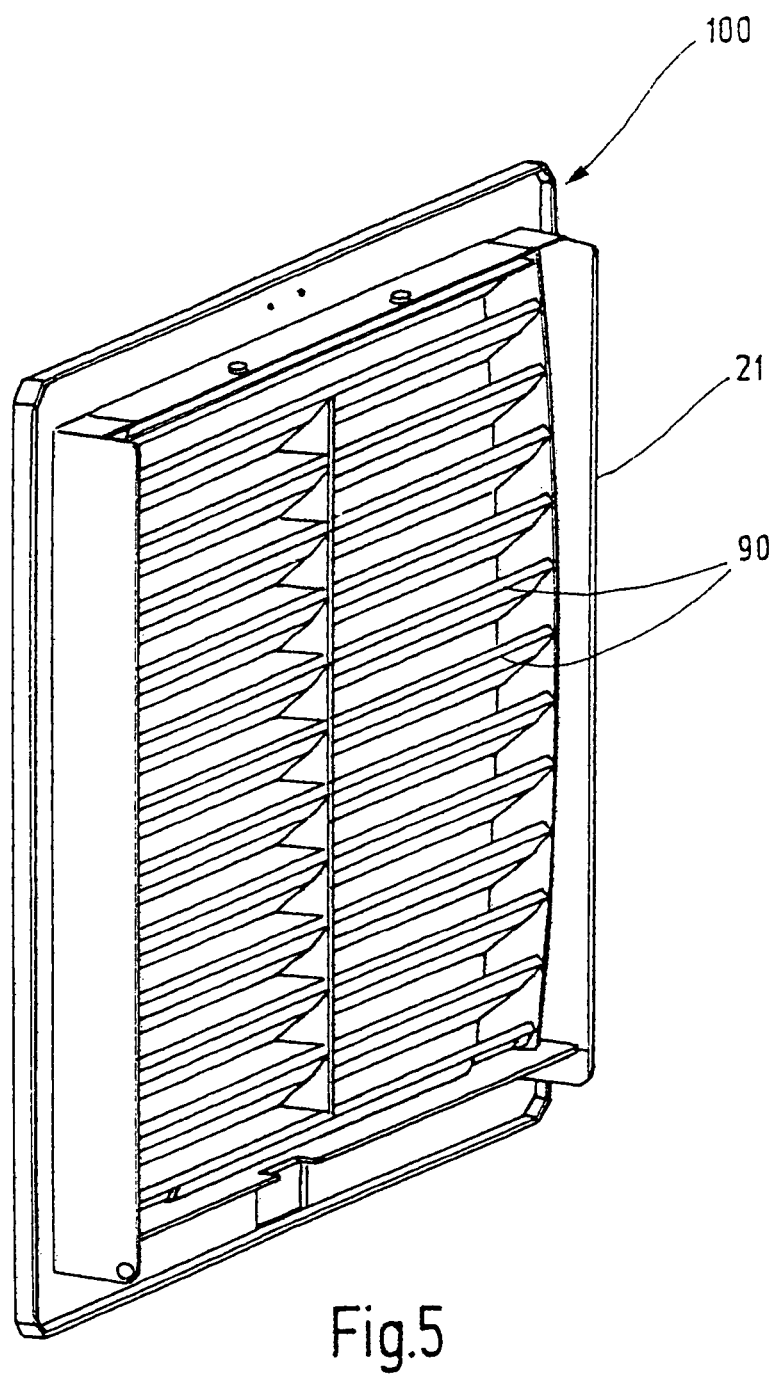
FIG. 5 shows a graphical rear view of the design cover.
Figure 6:
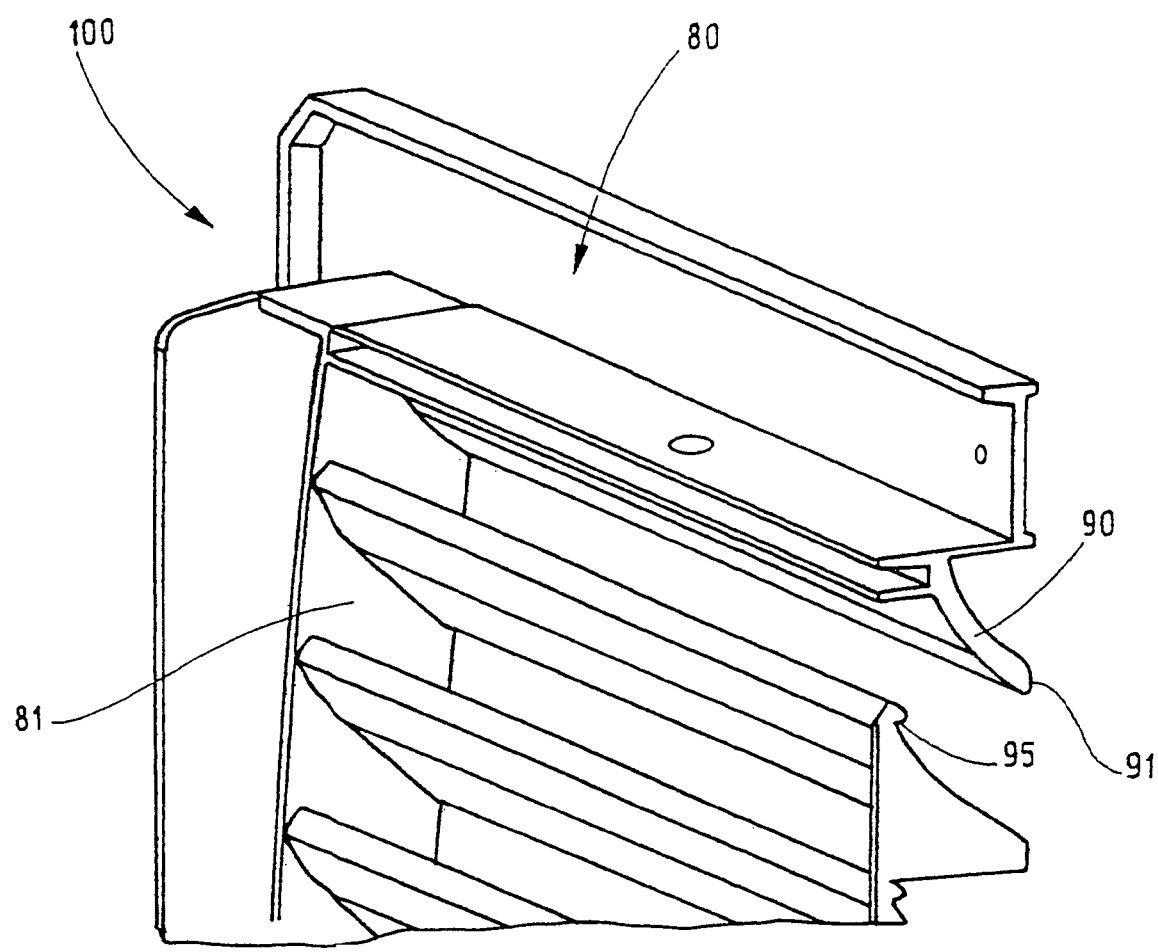
FIG. 6 shows an enlarged graphical representation of a section of the design cover.
Figure 7:
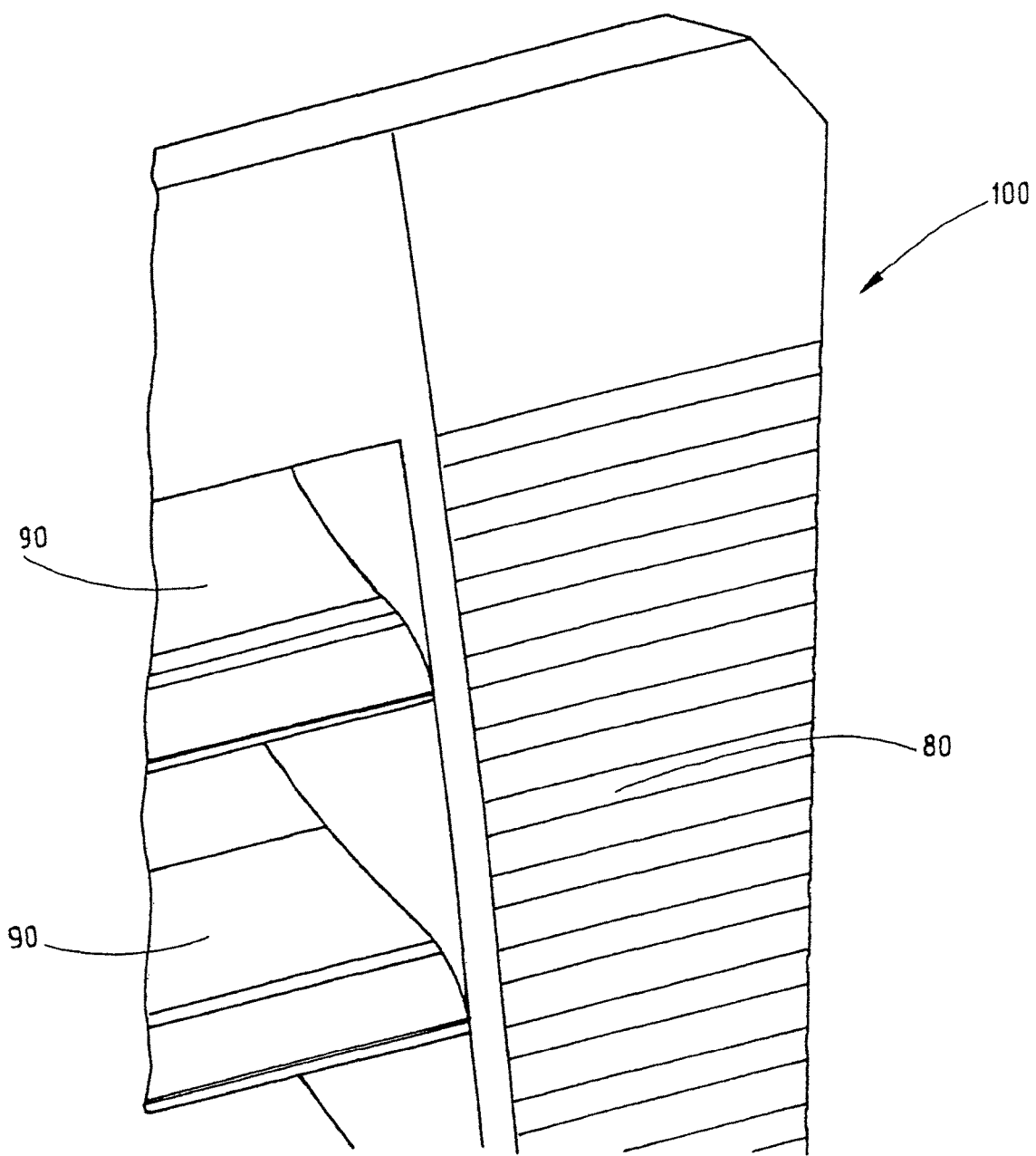
FIG. 7 shows an enlarged graphical representation of a section of the design cover.

The covering device 100 consists of a frame-type casing 30 for receiving the filter mat 60 and of a design cover 80 fixedly, detachably or swivellably held in the casing 30, which covers the filter mat 60. This design cover 80 comprises at least two lateral retaining elements 81, 82 having preferably the shape of cheeks, extending on the edge, between which the lamellar elements 90 are placed (FIGS. 4 and 5). The lamellar elements 90 are placed spaced from each other by simultaneously overlapping each other sectionwise and which are placed obliquely in such a manner that the respectively front and outer situated lamellar edges 91 are placed lower than the rear lamellar edges 92. The upper rear lamellar edges 92 of the lamellar elements 92 which have an arc-shaped configuration, have barb-shaped or hook-shaped configured conformations 95 (FIGS. 6 to 8, 8A and 9).

Figure 8:
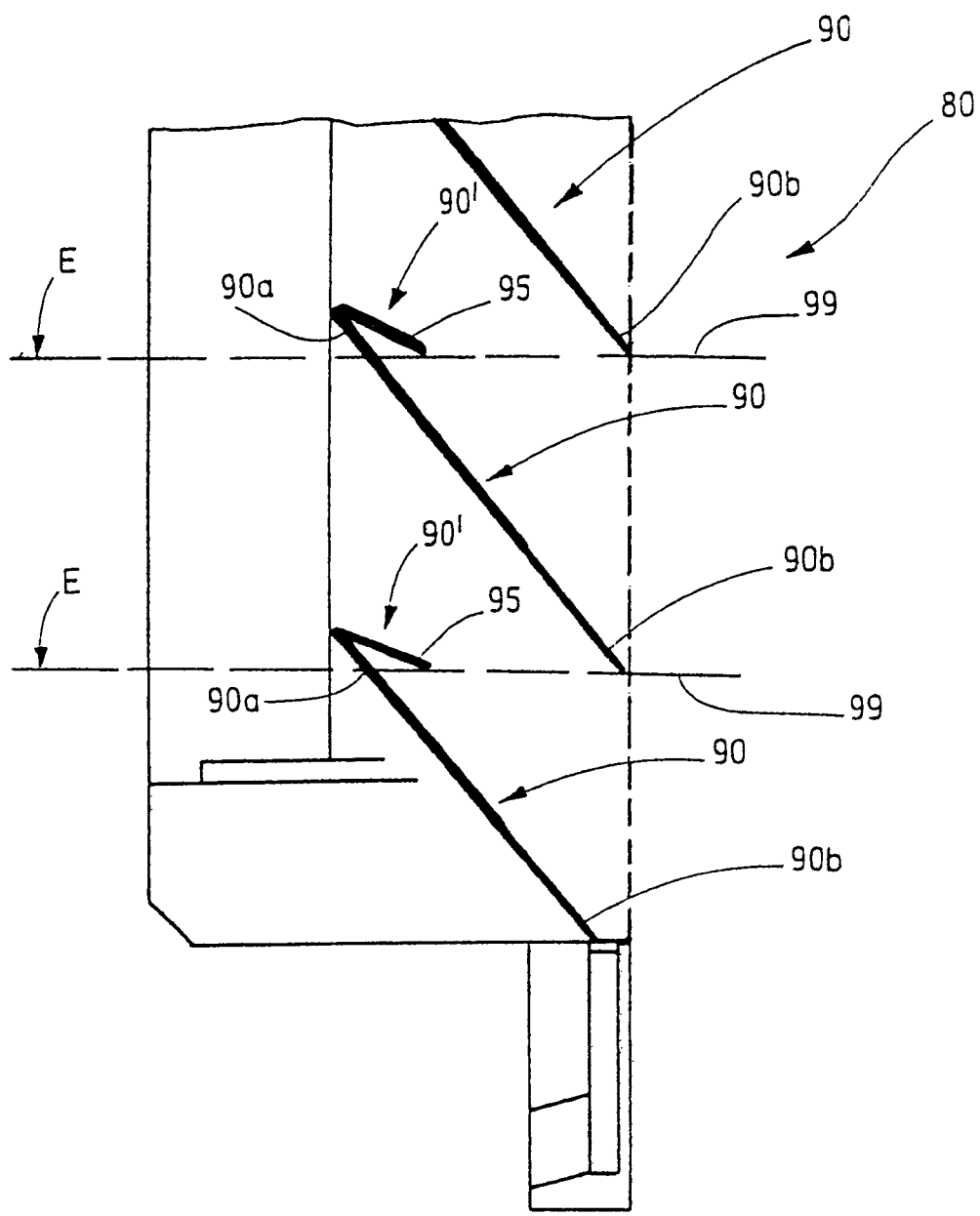
FIG. 8 shows an enlarged longitudinal section of the section of the design cover with lamellar elements with an end-sided hook-type configuration.
Figure 8A:
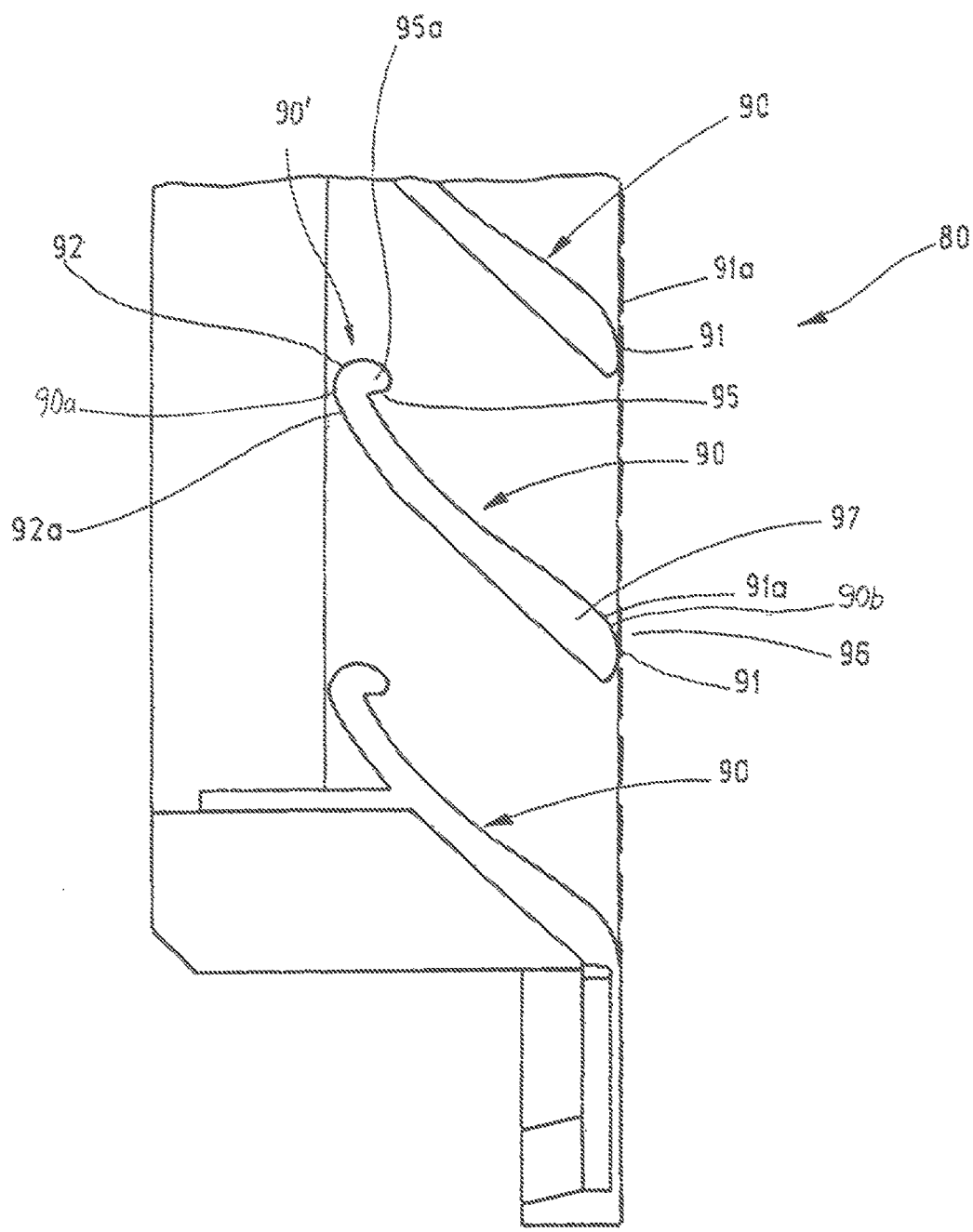
FIG. 8A shows an enlarged longitudinal section of a further embodiment of the section of the design cover with lamellar elements.
Figure 9:
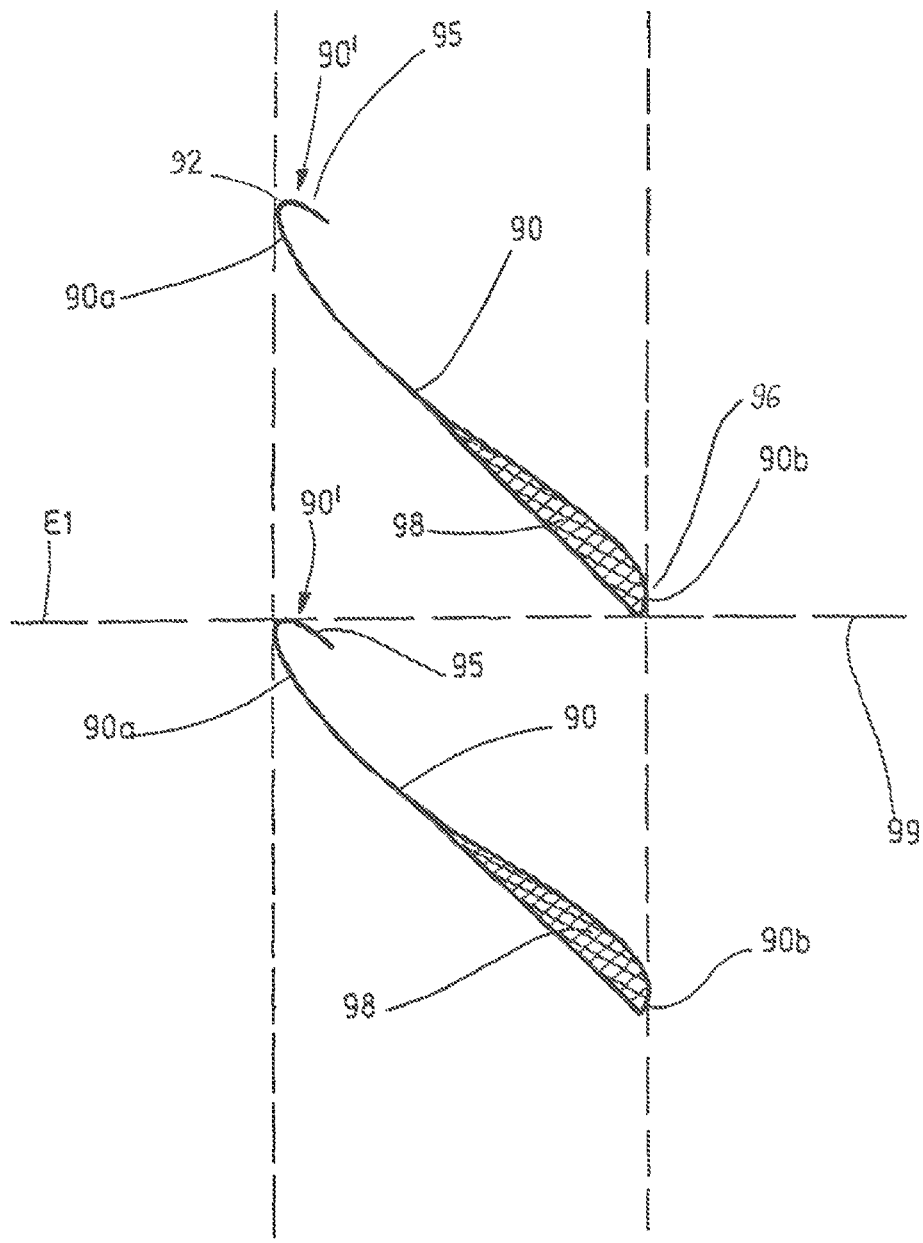
FIG. 9 shows schematically the arrangement of two lamellar elements with aerodynamically configured front end areas.

As the FIG. 8, 8A and 9 show, each lamellar element 90 has in its upper area 90a a section 90' orientated against the air admission with a hook-type configuration 95. The section 90' with the hook-type configuration 95 extends over the length of the lamellar element 90. This being, the lamellar elements 90 are placed with respect to each other in such a manner that the lamellar elements overlap sectionwise, whereby the respective lower area 90b of each lamellar element is situated on a horizontal plane E below the section 90' with the hook-type configuration (see FIG. 8) or on a horizontal plane E1 above the section 90' with the hook-type configuration 95 (see FIG. 9) or in an area between the two planes E and E1.

Moreover, the single lamellar elements 90 are placed with respect to each other in such a manner that a high optical overlapping and a visual protection of the filter mat 60 is obtained with an optimal air permeability.

In order to achieve a noise optimized lamellar shape, each lamellar element 90 has rounded front longitudinal border edges 96.

In FIG. 9, the rear lamellar edge 92 which has the barber-type configuration 95 of each lamellar element 90 has a cross-section shape which corresponds approximately to the shape of a half circle with a section 95a projecting on the front side. In FIG. 8A, the area of the front lamellar edge 91 of each lamellar element 90 has a material reinforcement 97 so that the lower situated front border edge section 91a of each lamellar element has a bigger thickness compared to the rear and higher situated border edge area 92a. Because of this configuration, each lamellar element 90 has an arc-shaped surface which merges in the upper area of each lamellar element into the barb-type lamellar configuration. In this manner, water sucked by the fan of the device for passage of air 200 is retained by the barb-type configuration 95 of the single lamellar elements 90 and drops off downwards or single accumulating droplets grow and run out then to the front.

The design cover 80 with its lamellar elements 90 is preferably made of a synthetic material or of another appropriate material.

In FIG. 9, two superimposed lamellar elements 90 are represented which are placed with respect to each other in such a manner that there results an overlap. The lamellar elements 90 are configured approximately S-shaped, whereby a material padding 98 is provided in the front bent-off area 90b of each lamellar element so that an aerodynamic area is created since without this measure it can come to air quantity losses. The upper area 90a of each lamellar element 90 has the hook-type configuration 95. The respective overlap area of two lamellar elements 90 is indicated by 99.

Each lamellar element 90 can be configured in one piece (FIG. 4) or in two pieces (FIG. 5) or consist of several sections of same length or with a different length.

LIST OF REFERENCE NUMERALS

200 Device for the passage of air
100 Covering device
20 Blast
21 Basic casing
25 Blast support
26 Blast
30 Frame-type casing
50 Mounting breach
51 Wall
60 Filter mat
80 Design cover
81 Retaining elements
82 Retaining elements
90 Lamellar elements
90a Upper area
90b Front area
91 Front lamellar edges
91a Front border edge area
92 Rear lamellar edges
92a Rear border edge area 95 Barb-type configuration
95a Projecting section
96 Rounded front longitudinal border edges
97 Material reinforcement
98 Material padding
99 Overlapping area

The invention claimed is:

1. A filter fan for insertion in an opening in a wall of a casing of waste heat producing components, such as an electronic cupboard, a switch cupboard, or a computer, said filter fan comprising:
   a basic casing;
   a ventilator support;
   a ventilator;
   a filter mat; and
   a cover for covering a front area of said filter fan, said cover comprising a square-shaped frame consisting of two side walls, a top wall and a bottom wall and a number of inclined lamellar elements covering the filter mat, said lamellar elements being disposed within said frame and being attached to both side walls, wherein the cover has a front side being turned away from the filter mat and a back side being turned towards the filter mat;
   wherein each lamellar element has a lower front lateral edge, an upper rear lateral edge, and a middle portion connecting the lower front lateral edge and the upper rear lateral edge, said lower front lateral edge being turned towards the front side of the cover and said upper rear lateral edge being turned towards the back side of the cover;
   wherein the upper rear lateral edge of each lamellar element has a transverse cross section which is formed as a hook, said hook being oriented against an airflow direction of air flowing through the filter fan, wherein a portion of the transverse cross section is bent back towards the middle portion of the lamellar element under an angle of at least 90° so as to form the hook;
   wherein the lower front lateral edge of each lamellar element has a transverse cross section which is not formed as a hook, said hook having an upper endpoint and a lower endpoint, said upper endpoint and said lower endpoint being defined by an upper end and a lower end of the transverse cross section;
   wherein each lamellar element has a lower end at its lower front lateral edge defined by the lowest point of the lamellar element;
   wherein the lamellar elements are disposed with respect to each other to overlap sectionwise, so that the lower end of an upper lamellar element aligns with a midpoint of the hook of a lower lamellar element;
   wherein the lamellar elements are arranged spaced from each other and are arranged obliquely in such a manner that the lower front lateral edge of each lamellar element is placed lower than its upper rear lateral edge;
   wherein the basic casing is a one-piece part, wherein the cover is a one-piece part, wherein the filter mat is disposed inside an accommodation volume formed solely by the basic casing and the cover in a form-fitted and removable manner.

2. The filter fan according to claim 1, wherein the lamellar elements are placed with respect to each other in such a manner that lamellar elements overlap for a visual protection of the filter mat.

3. The filter fan according to claim 1, wherein in order to achieve a noise optimized lamellar shape, each lamellar element has rounded front longitudinal border edges.

4. The filter fan according to claim 1, wherein the portion of the transverse cross section is bent back towards the middle portion of the lamellar element under an angle of at least 135°.

5. A filter fan for insertion in an opening in a wall of a casing of waste heat producing components, such as an electronic cupboard, a switch cupboard, or a computer, said filter fan comprising:
   a basic casing;
   a ventilator support;
   a ventilator;
   a filter mat; and
   a cover for covering a front area of said filter fan, said cover comprising a square-shaped frame consisting of two side walls, a top wall and a bottom wall and a number of inclined lamellar elements covering the filter mat, said lamellar elements being disposed within said frame and being attached to both side walls, wherein the cover has a front side being turned away from the filter mat and a back side being turned towards the filter;
   wherein each side wall of the cover comprises a cheek-shaped lateral retaining elements, wherein said retaining elements extend on the edge of the cover;
   wherein the lamellar elements extend between the retaining elements and are attached to the retaining elements;
   wherein the lamellar elements have different lengths, wherein the outermost lamellar elements, when seen in the vertical direction, have a shortest length;
   wherein each lamellar element has a lower front lateral edge and a an upper rear lateral edge, and a middle portion connecting the lower front lateral edge and the upper rear lateral edge, said lower front lateral edge being turned towards the front side of the cover and said upper rear lateral edge being turned towards the back side of the cover, wherein the upper rear lateral edge of each lamellar element has a transverse cross section that is formed as a hook, said hook being oriented against an airflow direction of air flowing through the filter fan, wherein a portion of the transverse cross section is bent back towards the middle portion of the lamellar element under an angle of at least 90° so as to form the hook;
   wherein the lower front lateral edge of each lamellar element has a transverse cross section which is not formed as a hook, said hook having an upper endpoint and a lower endpoint, said upper endpoint and said lower endpoint of the hook being defined by an upper end and a lower end of the transverse cross section;
   wherein each lamellar element has a lower end at its lower front lateral edge defined by the lowest point of the lamellar element;
   wherein the lamellar elements are disposed with respect to each other to overlap sectionwise, so that the lower end of an upper lamellar element aligns with a midpoint of the hook of a lower lamellar element;
   wherein the lamellar elements are arranged spaced from each other and are arranged obliquely in such a manner that the lower front lateral edge of each lamellar element is placed lower than its upper rear lateral edge.

6. The filter fan according to claim 5, wherein the portion of the transverse cross section is bent back towards the middle portion of the lamellar element under an angle of at least 135°.

* * * * *